United States Patent [19]
Katsumata et al.

[11] Patent Number: 5,886,395
[45] Date of Patent: Mar. 23, 1999

[54] SEMICONDUCTOR DEVICE HAVING BIPOLAR TRANSISTOR WITH UNIQUE RATIO OF BASE GUMMEL NUMBER TO IMPURITY CONCENTRATION OF COLLECTOR REGION

[75] Inventors: Yasuhiro Katsumata, Chigasaki; Chihiro Yoshino; Kazumi Inoh, both of Yokohama, all of Japan

[73] Assignee: Kabushiki Kaisha Toshiba, Kawasaki, Japan

[21] Appl. No.: 956,763

[22] Filed: Oct. 22, 1997

Related U.S. Application Data

[63] Continuation of Ser. No. 649,515, May 17, 1996, abandoned.

[30] Foreign Application Priority Data

May 19, 1995 [JP] Japan .................................. 7-121536
Apr. 30, 1996 [JP] Japan .................................. 8-109572

[51] Int. Cl.$^6$ ................ H01L 27/082; H01L 27/102; H01L 29/70; H01L 31/11
[52] U.S. Cl. ..................... 257/585; 257/587; 257/588; 438/322
[58] Field of Search ................... 257/585, 587, 257/588; 438/322

[56] References Cited

U.S. PATENT DOCUMENTS

| | | | |
|---|---|---|---|
| 4,578,633 | 3/1986 | Aoki | 323/315 |
| 4,837,176 | 6/1989 | Zdebel et al. | 437/31 |
| 4,897,704 | 1/1990 | Sakurai | 357/35 |
| 5,481,132 | 1/1996 | Moreau | 257/566 |
| 5,656,514 | 8/1997 | Ahlgren et al. | 438/320 |

OTHER PUBLICATIONS

Stanley Wolf Ph.D., Silicon Processing for the VLSI Era (vol. 2: Process Integration), Chapter 7: Bipolar and BIC-MOS Process Integration (Section 7.3.1: Current Gain), p. 465, 1990.

Meister et al, "Selective Epitaxial Bipolar Technology for 25 to 40 Gb/s ICs", T:SS–DERC, 1993, pp. 203–210.

Crabbé et al, "Vertical Profile Optimization of Very High Frequency Epitaxial Si–and SiGe–Base Bipolar Transistors", 1993 IEEE, IEDM 93–83, pp. 4.6.1 –4.6.4.

*Primary Examiner*—Mahshid Saadat
*Assistant Examiner*—Allan R. Wilson
*Attorney, Agent, or Firm*—Foley & Lardner

[57] ABSTRACT

To obtain both the highest possible maximum operating frequency $f_{max}$ and early voltage $V_A$, a semiconductor device provided with a bipolar transistor including a collector region, a base region formed on the collector region, an emitter region formed in contact with the base region, a base leading electrode connected to the base region, and an emitter electrode connected to the emitter region, is characterized in that a ratio $Q_B/N_c$ of base Gunmel number $Q_B$ to impurity concentration $N_C$ of the collector region of the bipolar transistor lies within a range from $0.2 \times 10^{-3}$cm to $2.5 \times^{-3}$cm.

16 Claims, 21 Drawing Sheets

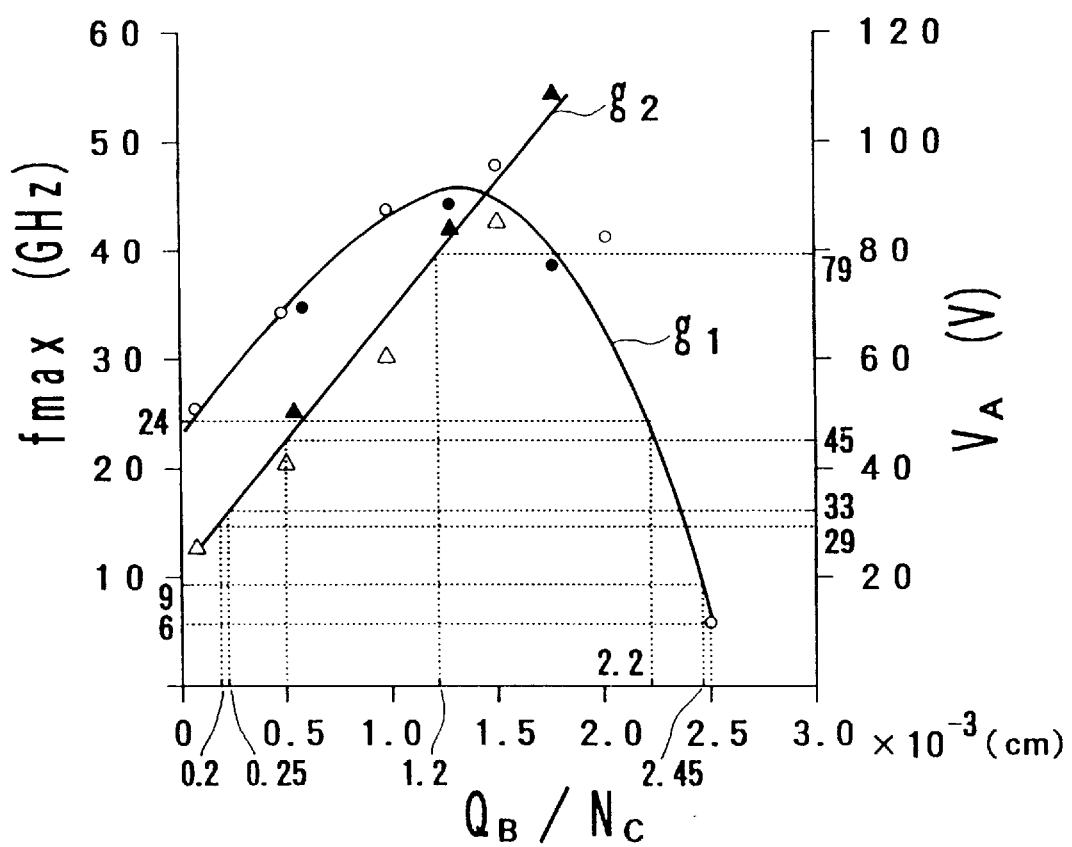
F I G. 1A

| COMMUNICATIONS SYSTEMS | SUPPLY VOLTAGE [V] | fmax [GHz] | $V_A$ [V] | $Q_B/N_C$ [$\times 10^{-3}$cm] |
|---|---|---|---|---|
| 600Mbps OPTICAL COMMUNICATIONS SYSTEM | 5.0 | 6 | 79 | 1.2 ~ 2.5 |
| 600Mbps OPTICAL COMMUNICATIONS SYSTEM | 3.3 | 6 | 45 | 0.5 ~ 2.5 |
| 2.4Gbps OPTICAL COMMUNICATIONS SYSTEM | 5.0 | 24 | 79 | 1.2 ~ 2.2 |
| 2.4Gbps OPTICAL COMMUNICATIONS SYSTEM | 3.3 | 24 | 45 | 0.5 ~ 2.2 |
| 900MHz MOBILE TELEPHONE SYSTEM | 3.3 | 9 | 45 | 0.5 ~ 2.45 |
| 900MHz MOBILE TELEPHONE SYSTEM | 2.7 | 9 | 33 | 0.25 ~ 2.45 |
| 1.5GHz AUTOMOTIVE VEHICLE TELEPHONE SYSTEM | 3.3 | 15 | 45 | 0.5 ~ 2.37 |
| 1.5GHz AUTOMOTIVE VEHICLE TELEPHONE SYSTEM | 2.5 | 15 | 29 | 0.2 ~ 2.37 |
| 1.8GHz MOBILE TELEPHONE SYSTEM | ~2.7 | 18 | 33 | 0.25 ~ 2.33 |
| 1.9GHz MOBILE TELEPHONE SYSTEM | ~2.7 | 19 | 33 | 0.25 ~ 2.32 |
| 24GHz RADIO LAN SYSTEM | 3.3 | 24 | 45 | 0.5 ~ 2.2 |

FIG. 2

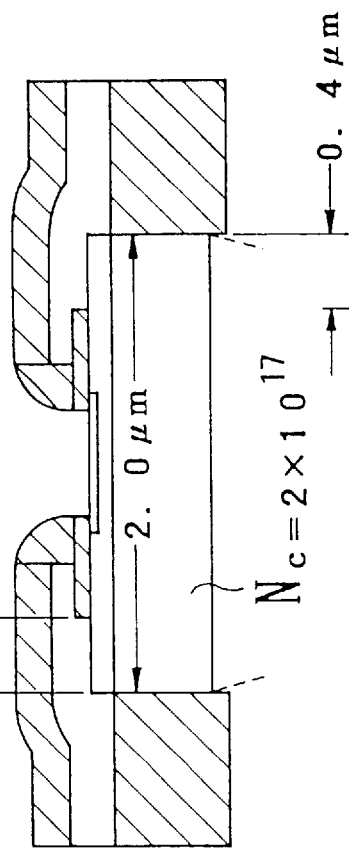
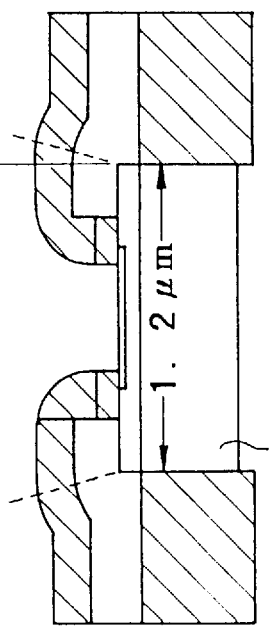
FIG. 4A-1 GRAFT BASE LAYER DIFFUSION WINDOW
$N_c = 2 \times 10^{17}$
FIG. 4A-2
$N_c = 3 \times 10^{16}$
FIG. 4B
$C_{jc} = 25.3\,fF$ → SCALE DOWN (REDUCE $N_c$) → $C_{jc} = 8.2\,fF$

SEMICONDUCTOR DEVICE HAVING BIPOLAR TRANSISTOR WITH UNIQUE RATIO OF BASE GUMMEL NUMBER TO IMPURITY CONCENTRATION OF COLLECTOR REGION

This application is a continuation, of application Ser. No. 08/649.515, filed May 17, 1996, now abandoned.

BACKGROUND OF THE INVENTION

1. Field of the Invention

The present invention relates to a semiconductor device, and more specifically to the structure of a bipolar transistor usable in a high frequency analog field.

2. Description of the Prior Art

Recently, the operation speed of LSIs has been increased markedly. However, a further improvement in the operation speed of analog LSIs has been still required in the field of not only digital systems represented by large scale computers but also mobile communications systems, etc. As the semiconductor elements for constructing the analog LSIs, in general, silicon bipolar transistors are now widely used owing to the excellent linearity and the mass productivity.

When the analog LSIs are designed, the design factors such as cut-off frequency $f_T$, maximum operating frequency $f_{max}$, early voltage $V_A$, etc. of the bipolar transistor must be considered as the indices of the high speed performance of the analog LSIs. Conventionally, however, in order to improve the high speed performance of the bipolar transistor with priority, there exists such a tendency that the maximum operating frequency $f_{max}$ has been improved by increasing the cut-off frequency $f_T$ as high as possible at the sacrifice of the early voltage $V_A$.

Therefore, conventionally, in order to increase the cut-off frequency $f_T$ of the bipolar transistor, the low-temperature epitaxial technique has been adopted to form a thin epitaxial base layer thereof, as shown in FIG. 18. FIG. 19 shows the characteristics of the cut-off frequency $f_T$ and the maximum operating frequency $f_{max}$ (ordinate) with respect to the collector current $I_C$ (abscissa) of the bipolar transistor manufactured as described above. FIG. 19 indicates that although the maximum value of the cut-off frequency $f_T$ can be increased as high as 44.3 GHz and further the maximum operating frequency $f_{max}$ can be also improved as high as 25.1 GHz, the early voltage $V_A$ is as low as 25 V.

In order to realize high frequency analog circuits, however, it is required that the maximum operating frequency $f_{max}$ and the early voltage $V_A$ are both high.

In more detail, as understood by the dependency of power gain upon frequency in the analog circuit shown in FIG. 20, for instance, the maximum operating frequency $f_{max}$ of the high frequency analog circuit is determined as a frequency at which the power gain (referred to as power amplification factor) becomes [1] or [0 dB]. Further, in the field of the analog circuits, the highest gain is required for amplifiers. However, when the power gain exceeds 20 dB greatly, since the probability of parasitic oscillation increases, the power gain is set to about 20 dB in general. Therefore, as understood by the graphical representation shown in FIG. 20, the operating frequency of the analog circuit is usually set to about 1/10 of the maximum operating frequency $f_{max}$. In other words, when the operating frequency of the analog circuits is decided on the basis of the design specifications, about ten times of the operating frequency is needed as the maximum operating frequency $f_{max}$ thereof.

On the other hand, the relationship between the early voltage $V_A$ and the supply voltage $V_{CC}$ is as follows:

Although various current source circuits are used for the bipolar ICs, the basic current source circuit results in a circuit as shown in FIG. 21, in which $I_{ref}$ to $I_{C0}$ is a reference current. In FIG. 21, a current $I_{C1}$ the same as the reference current $I_{C0}$ is supplied through a circuit of a transistor $Q_1$, whose structure is the same as a transistor $Q_0$. In the same way, a current $I_{Cn}$ n-times larger than the reference current $I_{C0}$ is supplied through a circuit in which n-units of transistors (each structure is the same as the transistor $Q_0$) are connected in parallel to each other.

Here, the bipolar transistor is provided with an early effect, so that the collector current $I_C$ can be expressed as $$I_C = I_S \cdot (1 + V_{CE}/V_A) \cdot \exp(V_{BE}/V_T)$$

where $I_S$ denotes a constant indicative of the transfer characteristics in the forward active region of the transistor; $V_{CE}$ denotes the collector-emitter voltage of the transistor; and $V_{BE}$ denotes the base-emitter voltage of the transistor. Further, $V_T$ can be expressed as $V_T = kT/q$ where k denotes a Boltzmann's constant, T denotes the absolute temperature of the transistor and q denotes the charge elementary quantity.

Consequently, the currents $I_{Cn}$ and $I_{C0}$ flowing through the transistors $Q_n$ and $Q_0$, respectively can be expressed as $$I_{Cn} = n \cdot I_S \cdot (1 + V_{CEn}/V_A) \cdot \exp(V_{BE}/V_T)$$

$$I_{C0} = I_S \cdot (1 + V_{CE0}/V_A) \cdot \exp(V_{BE}/V_T)$$

Therefore, the ratio of $I_{Cn}/I_{C0}$ is not an ideal value of n times but as $$I_{Cn}/I_{C0} = n(1 + V_{CEn}/V_A)/(1 + V_{CE0}/V_A)$$

By the way, when considering the degree at which the above-mentioned non-ideal state can be allowed, it is necessary to avoid at least such a state that (n+1)-time current flows when n-units of the transistors are connected in parallel. This is because it is impossible to control the transistor currents on the basis of the number of the transistors. On the other hand, since the number n of the transistors for constructing an ideal circuit is about n=20, it will be preferable to satisfy the following conditions:

$$20 \cdot (1 + V_{CEn}/V_A)/(1 + V_{CE0}/V_A) \leq 21$$

or $$(1 + V_{CEn}/V_A)/(1 + V_{CE0}/V_A) \leq 1.05$$

Here, since the collector-base voltage $V_{BC}$ is zero, $V_{CE0} = V_{BE}$ to 1, and further since $V_{CEn}$ is roughly the same as the supply voltage $V_{CC}$, the above-mentioned conditional expression can be expressed as $$(1 + V_{CC}/V_A)/(1 + 1/V_A) \leq 1.05$$

Therefore, the following expression can be obtained:

$$V_A \geq 20 \cdot V_{CC} - 21$$

As a result, when the supply voltage $V_{CC}$ is 3V, the early voltage $V_A$ as high as 39 V is required. In the conventional transistors, however, even if the thickness of the base layer is reduced with the use of the low-temperature epitaxial technique, since the early voltage $V_A$ is as low as 25 V, there exists a problem in that it is impossible to obtain a necessary early voltage $V_A$.

SUMMARY OF THE INVENTION

Accordingly, it is the object of the present invention is to provide a semiconductor device provided with a bipolar transistor having a high early voltage $V_A$ and a high maximum operating frequency $f_{max}$.

To achieve the above-mentioned object, the present invention provides a semiconductor device provided with a bipolar transistor including a collector region, a base region formed on the collector region, an emitter region formed in contact with the base region, a base leading electrode connected to the base region, and an emitter electrode connected to the emitter region, wherein a ratio $Q_B/N_C$ of base Gummel number $Q_B$ to impurity concentration $N_C$ of the collector region of the bipolar transistor lies within a range from $0.2 \times 10^{-3}$ cm to $2.5 \times 10^{-3}$ cm.

Further, it is possible to determine the ratio $Q_B/N_C$ between $0.5 \times 10^{-3}$ cm and $2.5 \times 10^{-3}$ cm.

Further, it is possible to determine the ratio $Q_B/N_C$ is between $0.5 \times 10^{-3}$ cm and $2.45 \times 10^{-3}$ cm.

Further, it is possible to determine the ratio $Q_B/N_C$ is between $0.5 \times 10^{-3}$ cm and $2.37 \times 10^{-3}$ cm.

Further, it is possible to determine the ratio $Q_B/N_C$ is between $0.5 \times 10^{-3}$ cm and $2.2 \times 10^{-3}$ cm.

Further, it is possible to determine the ratio $Q_B/N_C$ is between $0.25 \times 10^{-3}$ cm and $2.45 \times 10^{-3}$ cm.

Further, it is possible to determine the ratio $Q_B/N_C$ is between $0.25 \times 10^{-3}$ cm and $2.33 \times 10^{-3}$ cm.

Further, it is possible to determine the ratio $Q_B/N_C$ is between $0.25 \times 10^{-3}$ cm and $2.32 \times 10^{-3}$ cm.

Further, it is possible to determine the ratio $Q_B/N_C$ is between $1.2 \times 10^{-3}$ cm and $2.5 \times 10^{-3}$ cm.

Further, it is possible to determine the ratio $Q_B/N_C$ is between $1.2 \times 10^{-3}$ cm and $2.2 \times 10^{-3}$ cm.

Further, it is possible to determine the ratio $Q_B/N_C$ is between $0.2 \times 10^{-3}$ cm and $2.37 \times 10^{-3}$ cm.

Further, it is also preferable that a silicide-layer is formed on the base leading electrode.

BRIEF DESCRIPTION OF THE DRAWINGS

FIGS. 1A and 1B are graphical representations each for assistance in explaining the characteristics of a first embodiment of the semiconductor device according to the present invention;

FIG. 2 is table for assistance in explaining preferred $Q_B/N_C$ values required for each of the high frequency analog circuits;

FIG. 4A is a cross-sectional view showing a semiconductor device for assistance in explaining a scale-down for reducing the collector-base junction capacitance $C_{jc}$ thereof;

FIG. 4B is a flow chart for assistance in explaining a procedure of reducing the collector-base junction capacitance $C_{jc}$ thereof;

DETAILED DESCRIPTION OF THE PREFERRED EMBODIMENTS

Prior to the detailed description of the embodiments of the present invention, the circumstances, principle, and the outline of the present invention will be explained hereinbelow.

In the prior art transistors, in order to set importance on the high speed performance, an effort has been made to increase the cut-off frequency $f_T$ (because $f_T$ is an index of the high speed performance). Further, since the maximum operating frequency $f_{max}$ (as the other index of the high speed performance) is proportional to the square root of the cut-off frequency $f_T$, as understood by the following expression (1), increasing the maximum operating frequency $f_{max}$ has been obtained by increasing the cut-off frequency $f_T$.

$$f_{max} = \{f_T/(8 \cdot \pi \cdot C_{jc} \cdot R_b)\}^{1/2} \qquad (1)$$

where $C_{jc}$ denotes the collector-base junction capacitance (F); and $R_b$ denotes the base resistance ($\Omega$).

However, when an LSI is designed by assembling transistor circuits, functions as active elements are required for the respective transistors. In other words, when the frequency $f_T$ at which the current amplification factor is 1 is compared with the frequency $f_{max}$ at which the power amplification factor is 1, it seems that the maximum frequency $f_{max}$ is finally important as the characteristics of the active elements in the circuits.

In addition, in the case of the analog circuits, it is desirable that the collector current does not change violently even when the collector-emitter voltage $V_{CE}$ fluctuates within the non-saturation range of the transistor, so that it is important to improve the early voltage $V_A$. Here, the early voltage $V_A$ can be expressed as follows:

$$V_A = A \cdot (Q_B / C_{jc}) \quad (2)$$

where $Q_B$ denote the base Gummel number; and A denotes the collector-base junction area.

Figure 16:
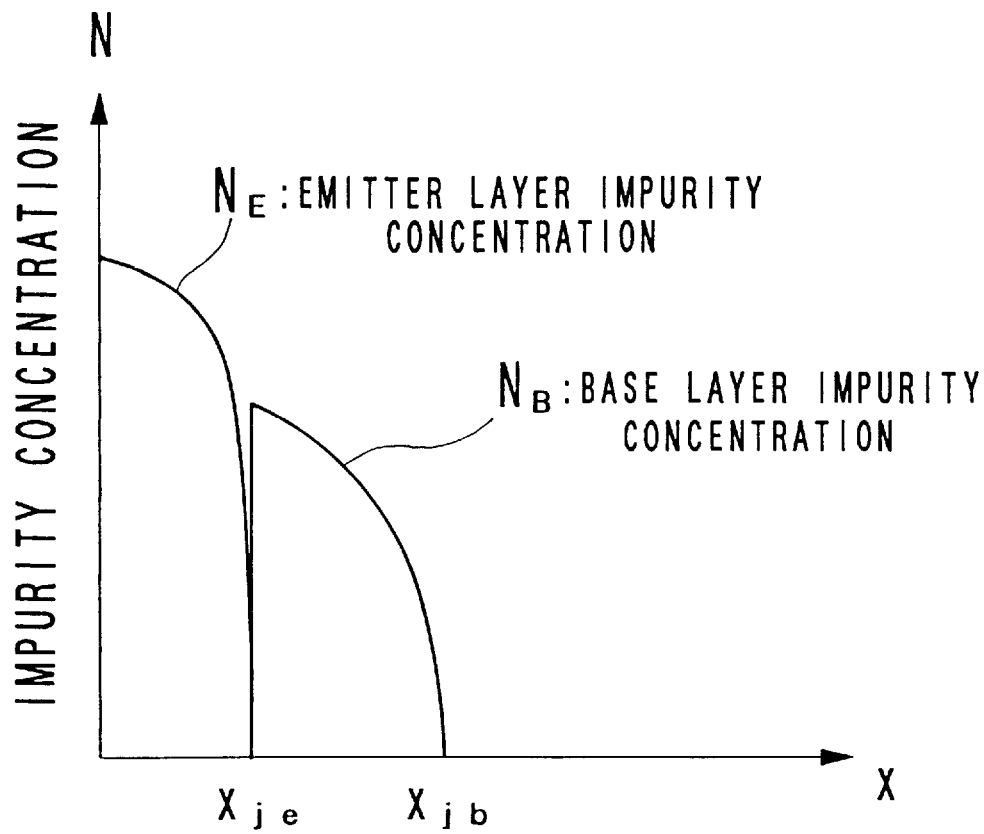
FIG. 16 is a graphical representation for assistance in explaining the definition of base Gummel number $Q_B$.
Figure 17A:
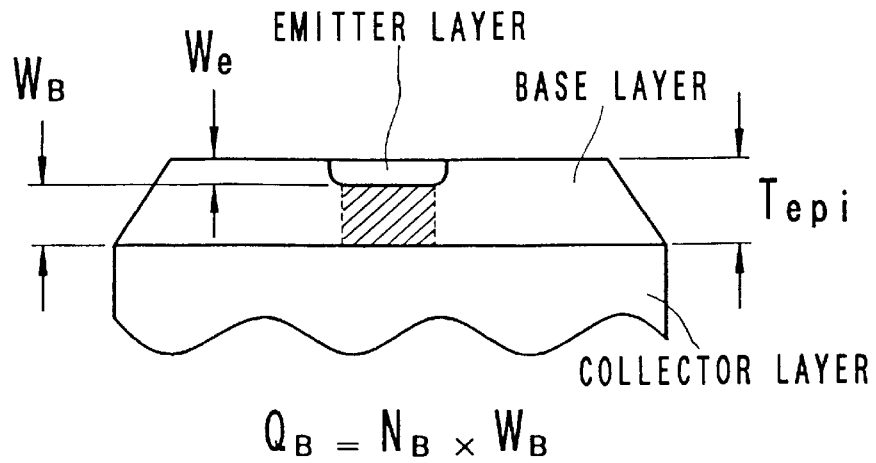
FIG. 17A is a cross-sectional view for assistance in explaining the base Gummel number $Q_B$ of a vertical bipolar transistor.
Figure 17B:
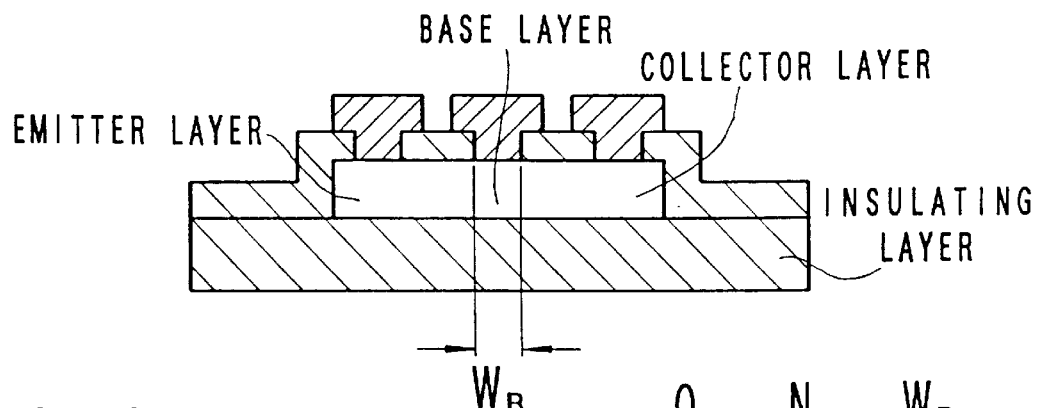
FIG. 17B is a cross-sectional view for assistance in explaining the base Gummel number $Q_B$ of a lateral bipolar transistor.
Figure 18:
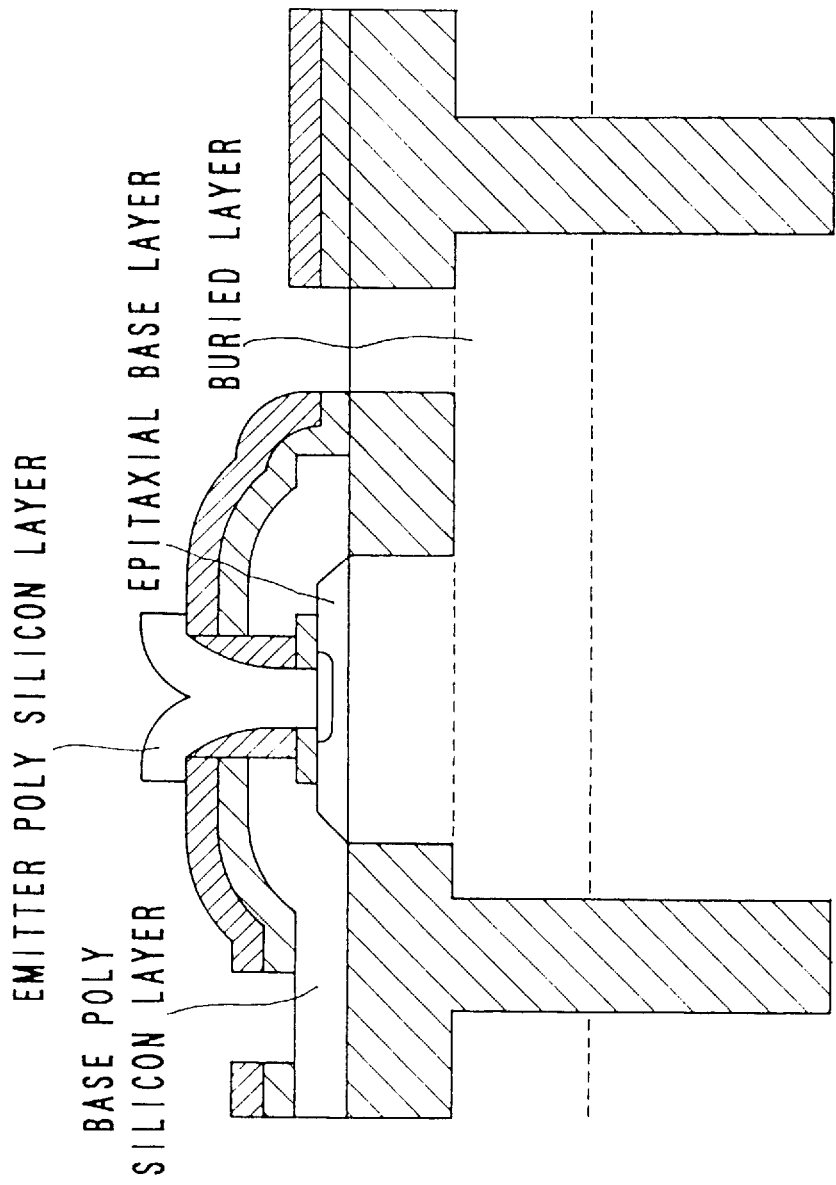
FIG. 18 is a cross-sectional view showing a prior art bipolar transistor.

Further, the Gummel number $Q_B$ (atm/cm$^2$) is a value obtained by integrating the base impurity concentration $N_B$ (atm/cm$^3$) with respect to x in the direction from the emitter region to the base region, as shown in FIG. 16, which can be represented by $\int N_B dx$. Further, the lower limit of the integral is at a junction surface position $x_{je}$ between the emitter layer and the base layer, and the upper limit thereof is at a junction surface position $x_{jb}$ between the base layer and the collector layer. Therefore, when the base impurity concentration $N_B$ is assumed to be constant, as shown in FIG. 17A, the Gummel number $Q_B$ of the vertical bipolar transistor is a value obtained by multiplying a value $W_B$ (obtained by subtracting the emitter layer thickness $W_e$ from the epitaxial base layer thickness $T_{epi}$) by the impurity concentration $N_B$ of the base layer. Further, as shown in FIG. 17B, the Gummel number $Q_B$ of the lateral bipolar transistor is a value obtained by multiplying the base layer thickness $W_B$ by the impurity concentration $N_B$ of the base layer.

As understood by the above expressions (1) and (2), since the factors $f_T$, $C_{jc}$, $R_b$ and $Q_B$ for defining the maximum operating frequency $f_{max}$ and the early voltage $V_A$ are all of the trade-off relationship, the Inventors have considered that there exist some optimum values of $f_{max}$ and $V_A$.

The present invention has been made on the basis of this original consideration. Any person skilled in the art except the inventors has never considered that there exist some optimum values of $f_{max}$ and $V_A$. The passage of the experiment on the present invention and the circumstances of the inventor's consideration will be explained hereinbelow.

First, when the collector-base junction capacitance $C_{jc}$ is reduced to increase both the maximum operating frequency $f_{max}$ and the early voltage $V_A$, although $f_{max}$ rises, $f_T$ decrease, as described later in further detail.

Secondly, when the base impurity concentration is increased to reduce the base resistance, although $f_{max}$ and $V_A$ both increase with increasing impurity concentration, $f_T$ hardly changes.

Further, when the thickness $T_{epi}$ of the base epitaxial layer is changed, although $f_{max}$ can be maximized at a value of $T_{epi}$, $V_A$ increases with increasing $T_{epi}$.

In the above-mentioned change range of $T_{epi}$, although the change in $f_{max}$ is small, $V_A$ changes largely. Therefore, in order to increase both the fags and $V_A$ as large as possible, it can be considered to increase a product of $f_{max}^2$ and $V_A$. Then, on the basis of the two expressions (1) and (2), it can be known that $(f_{max}^2 \cdot V_A)$ is proportional to $(Q_B/C_{jc}^2)$. On the other hand, since $C_{jc}$ is proportional of the square root of the collector impurity concentration $N_C$, $(f_{max}^2 \cdot V_A)$ is proportional to $(Q_B/N_C)$.

Therefore, when $f_{max}$ and $V_A$ are obtained by changing $Q_B/N_C$, as far as $Q_B/N_C$ ranges within a range from $0.2 \times 10^{-3}$ cm to $2.5 \times 10^{-3}$ cm, the maximum operating frequency $f_{max}$ is 6 GHz or higher and additionally the early voltage $V_A$ is 33 V or higher, with the result that it is possible to increase both the early voltage $V_A$ and the maximum operating frequency $f_{max}$ at the same time.

Some embodiments of the semiconductor device according to the present invention will be described hereinbelow with reference to the attached drawings.

Figure 19:
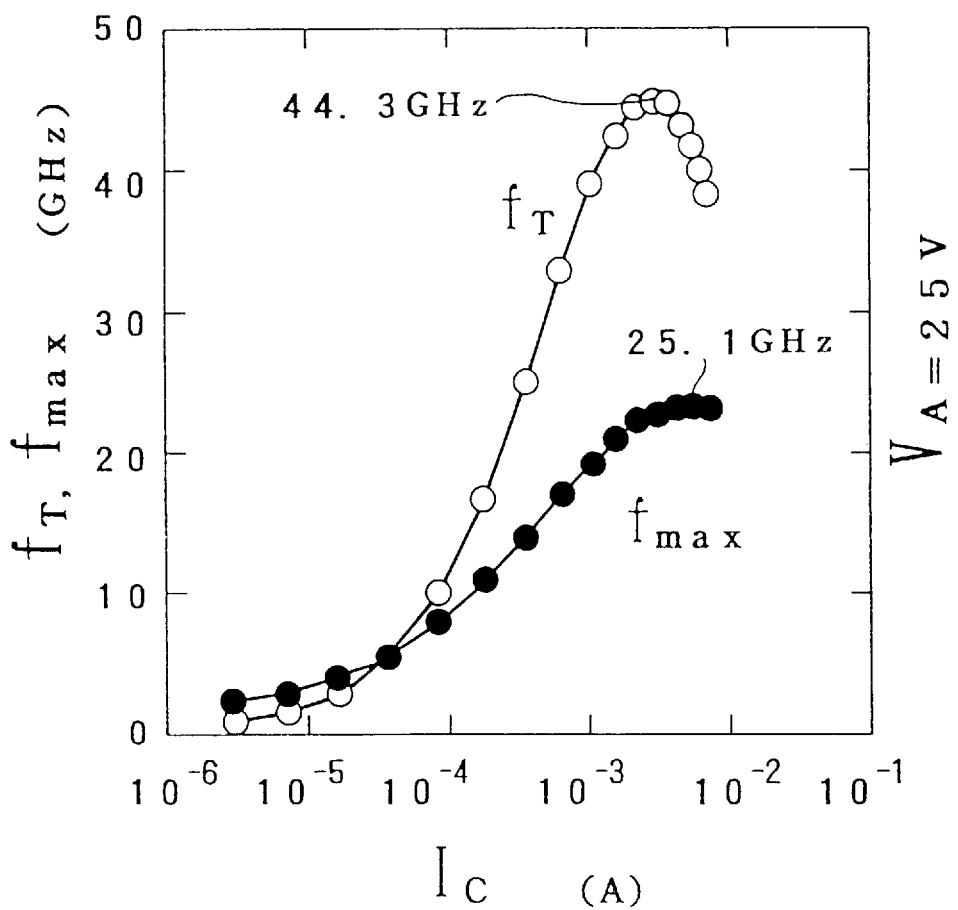
FIG. 19 is a graphical representation showing the characteristics of $f_T$, $f_{max}$ and $V_A$ with respect to $I_C$ of the prior art bipolar transistor.
Figure 20:
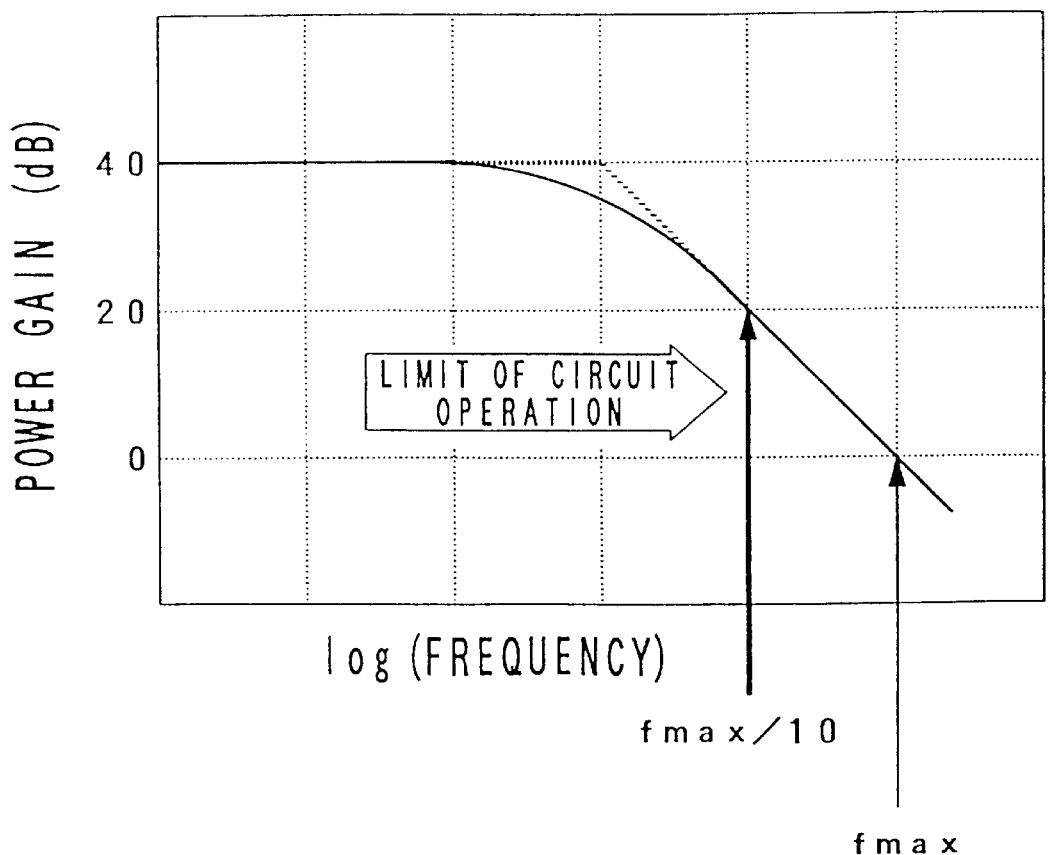
FIG. 20 is a graphical representation showing the dependency of the power gain upon the frequency in an analog high-frequency circuit.
Figure 21:
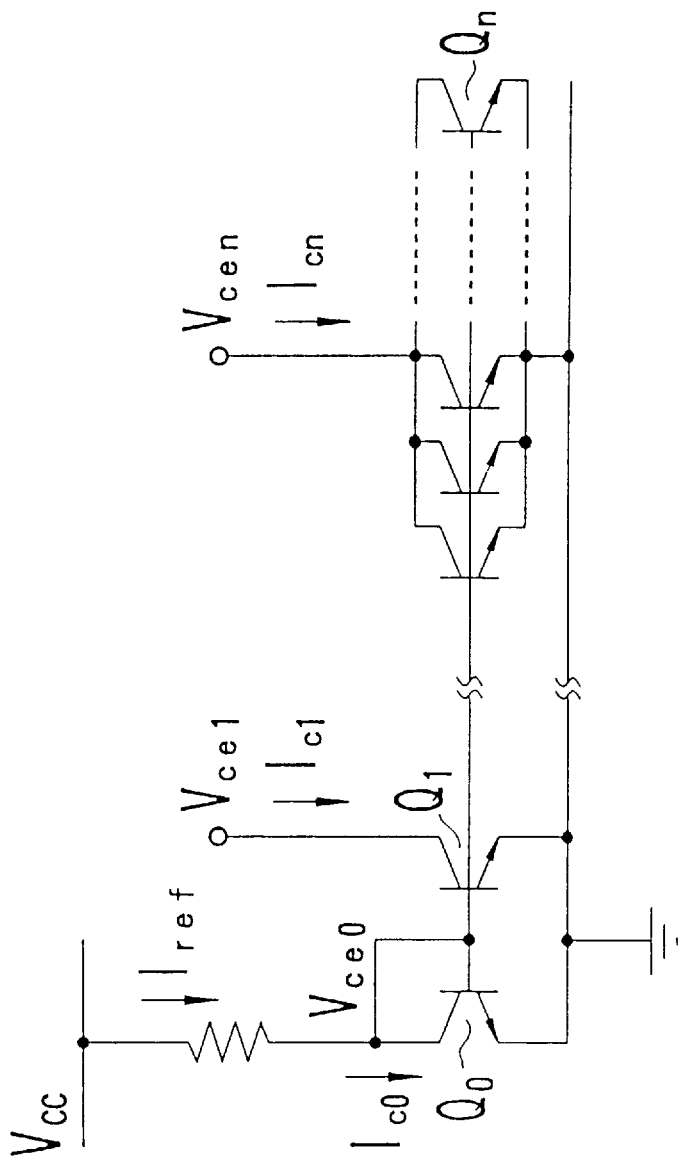
FIG. 21 is a circuit diagram showing a prior art basic current source circuit for assistance in explaining the relationship between the early voltage and the supply voltage.

Now, a reduction of the collector-base junction capacitance is taken into account in order to increase both the maximum operating frequency $f_{max}$ and the early voltage $V_A$ of a transistor. Here, the transistor according to the present invention will be compared with the afore-mentioned prior art transistor having the characteristics as shown in FIG. 19. In the prior art transistor, the width of the base-collector junction forming window is 2.0 $\mu$m; the collector concentration $N_C$ is $2 \times 10^{17}$cm$^{-3}$; and the collector-base junction capacitance $C_{jc}$ is 25.3 fF. Further, in the prior art transistor, the maximum operating frequency $f_{max}$ thereof is 25.1 GHz and the cut-off frequency $f_T$ thereof is 44.3 GHz both as shown in FIG. 19.

Figure 5:
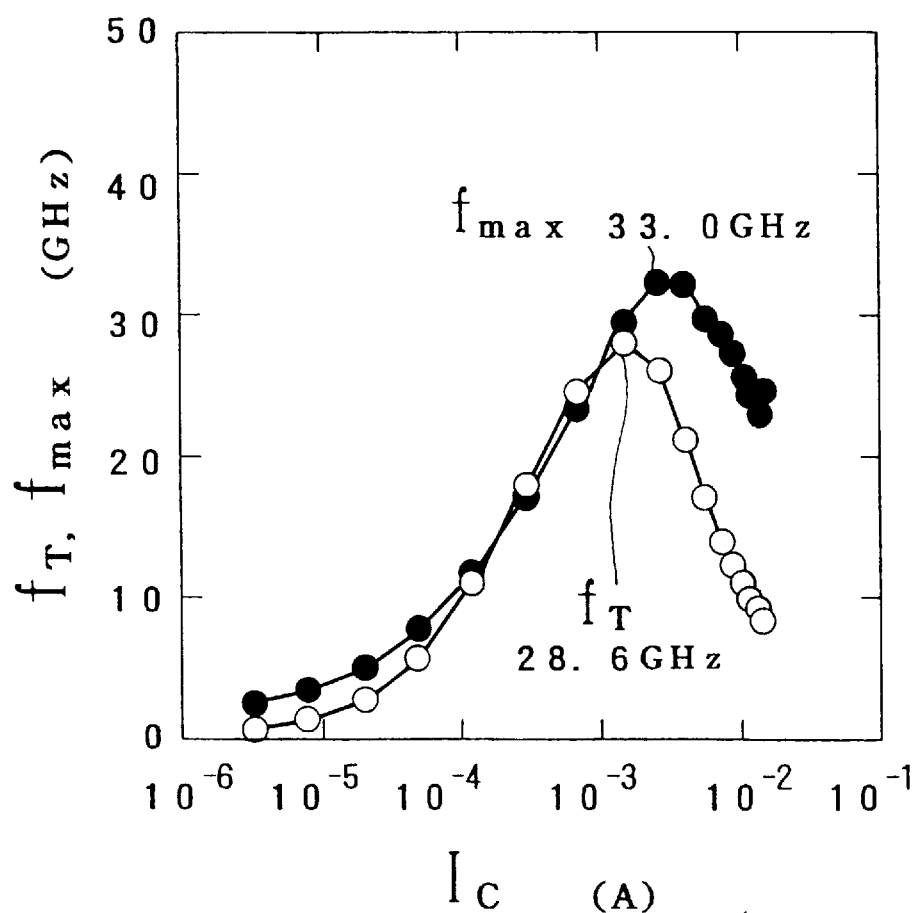
FIG. 5 is a graphical representation showing the characteristics of $f_T$ and $f_{max}$ with respect to $I_C$ obtained when the collector-base junction capacitance $C_{jc}$ is reduced.

On the other hand, in the transistor according to the present invention, as shown in FIGS. 4A and 4B, the width of a growth window for an epitaxial base layer is reduced from 2.0$\mu$m (prior art) to 1.2 $\mu$m; that is, the size of the graft base layer diffusion window is reduced by 0.4 $\mu$m, and in addition the impurity concentration Nc of the collector region is reduced from $2 \times 10^{17}$cm$^{-3}$ (prior art) to $3 \times 10^{16}$cm$^{-3}$. Under these conditions, the collector-base junction capacitance $C_{jc}$ can be decreased from 25.3 fF (prior art) to 8.2 fF. Here, FIG. 5 shows the characteristics of the cut-off frequency $f_T$ and the maximum operating frequency $f_{max}$ with respect to the collector current $I_C$ of the invention transistor having the collector-base Junction capacitance $C_{jc}$ of 8.2 fF. In comparison in characteristics between the prior art transistor as shown in FIG. 19 and the invention transistor as shown in FIG. 5, the maximum operating frequency $f_{max}$ can be increased from the 25.1 GHz (prior art) to 33.0 GHz. On the other hand, however, the cut-off frequency $f_T$ is reduced from 44.3 GHz (prior art) to 28.6 GHz. Further, the base impurity concentration $N_B$ of both the transistors is the same as $2 \times 10^{18}$cm$^{-3}$.

Figure 6:
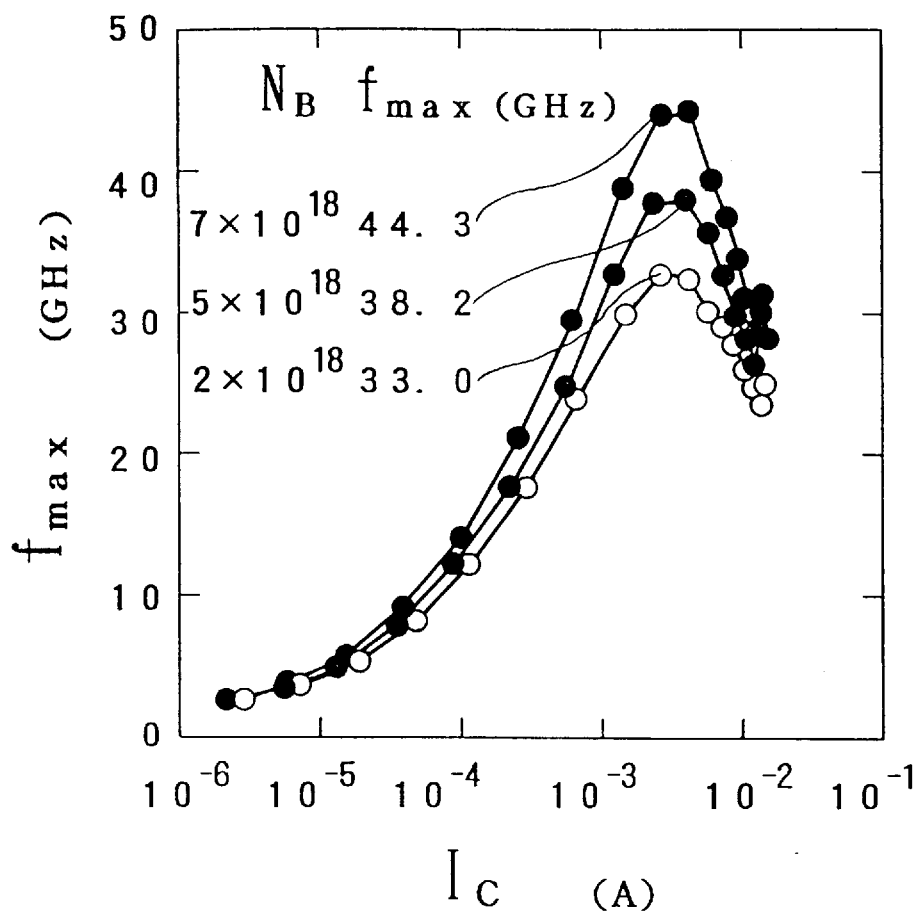
FIG. 6 is a graphical representation showing the characteristics of $f_{max}$ with respect to $I_C$ with the base impurity concentration $N_B$ as a parameter.
Figure 7:
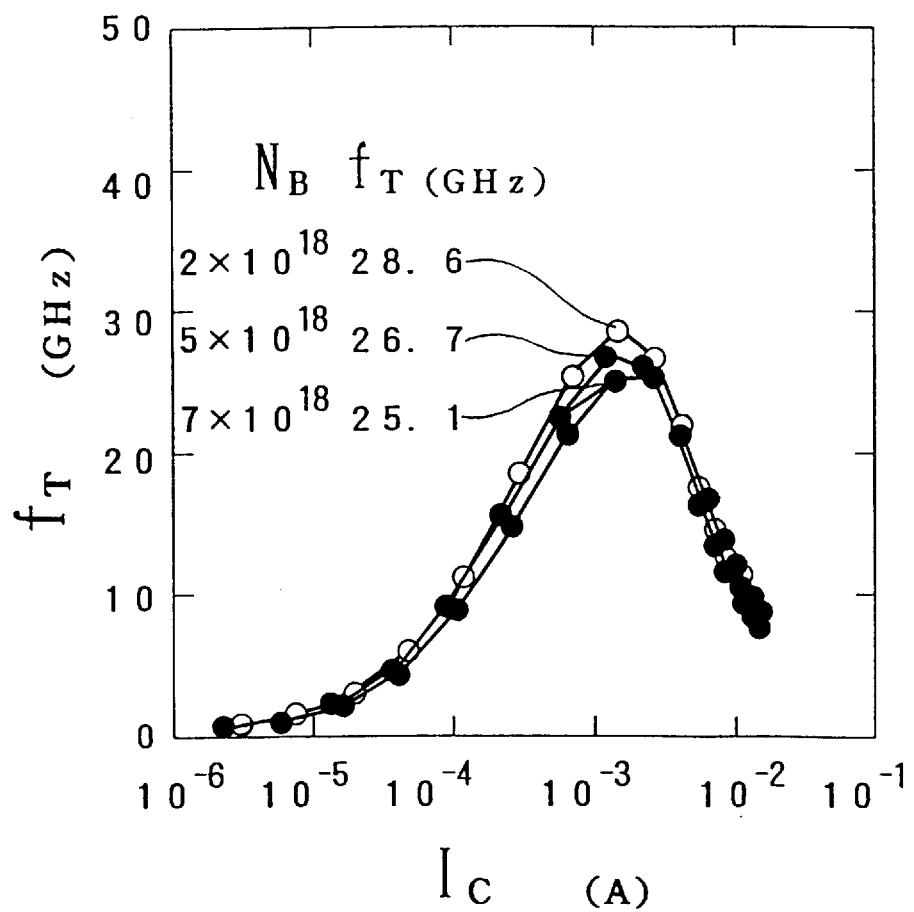
FIG. 7 is a graphical representation showing the characteristics of $f_T$ with respect to $I_C$ with the base impurity concentration $N_B$ as a parameter.

Secondly, in order to reduce the base resistance Rb, the base impurity concentration $N_B$ is increased from $2 \times 10^{18}$cm$^{-3}$ to $5 \times 10^{18}$cm$^{-3}$ and $7 \times 10^{18}$cm$^{-3}$. The characteristics between the maximum operating frequency $f_{max}$ and the collector current $I_C$ under these conditions are shown in FIG. 6, and those between the cut-off frequency $f_T$ and the collector current $I_C$ under the same conditions are shown in FIG. 7. FIG. 6 indicates that the maximum operating frequency $f_{max}$ increases with increasing base impurity concentration $N_B$ to such an extent as 38.2 GHz and 44.3 GHz when $N_B$ is $5 \times 10^{18}$cm$^{-3}$ and $7 \times 10^{18}$cm$^{-3}$, respectively. On the other hand, FIG. 7 indicates that although slightly decreasing with increasing base impurity concentration $N_B$, the cut-off frequency $f_T$ can be considered as being kept roughly at the same level, irrespective of the base impurity concentration $N_B$.

Figure 8:
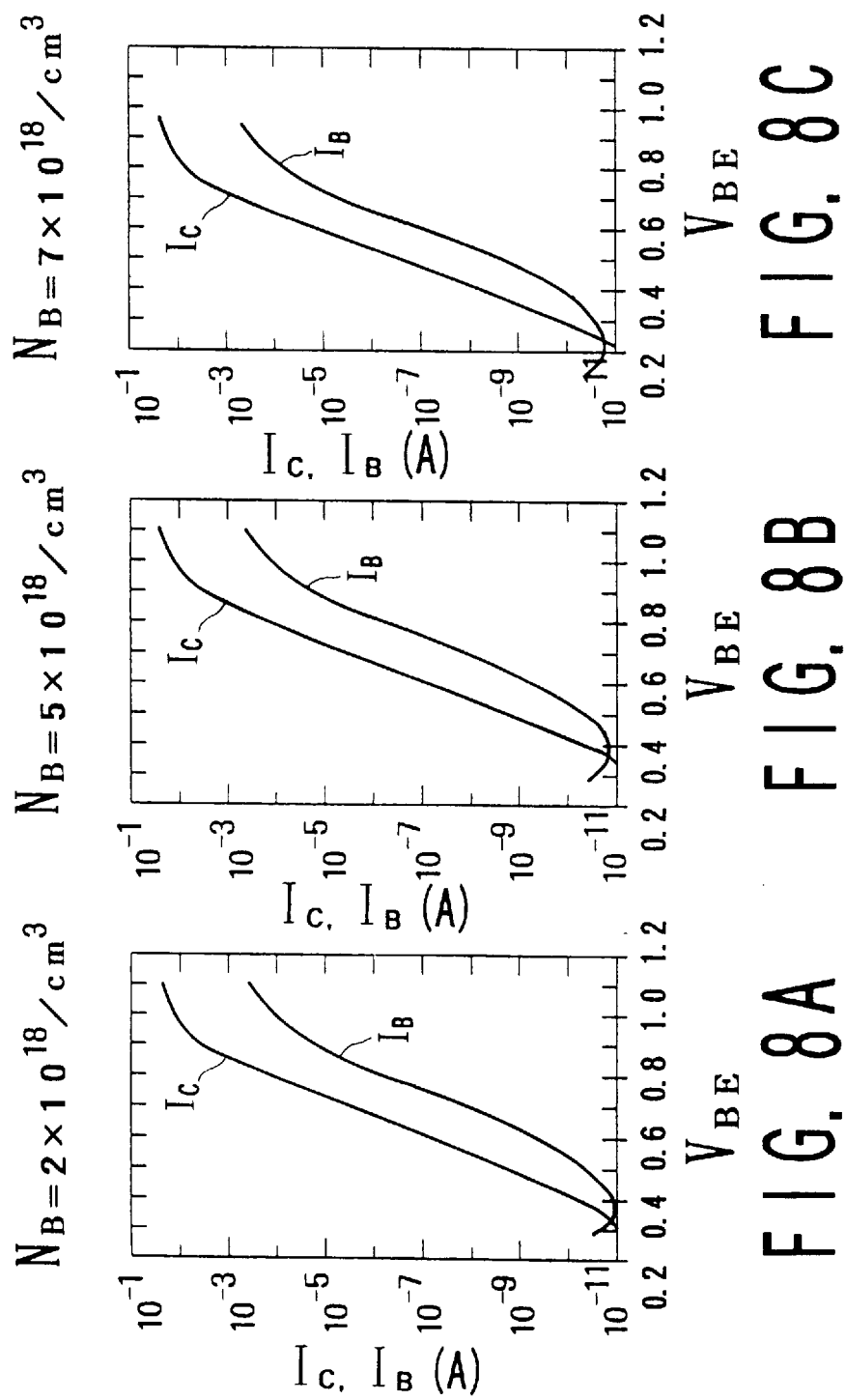
FIGS. 8A to 8C are graphical representations showing the characteristics of $I_C$ and $I_B$ with respect to $V_{BE}$ at a base impurity concentration $N_B$, respectively.
Figure 9:
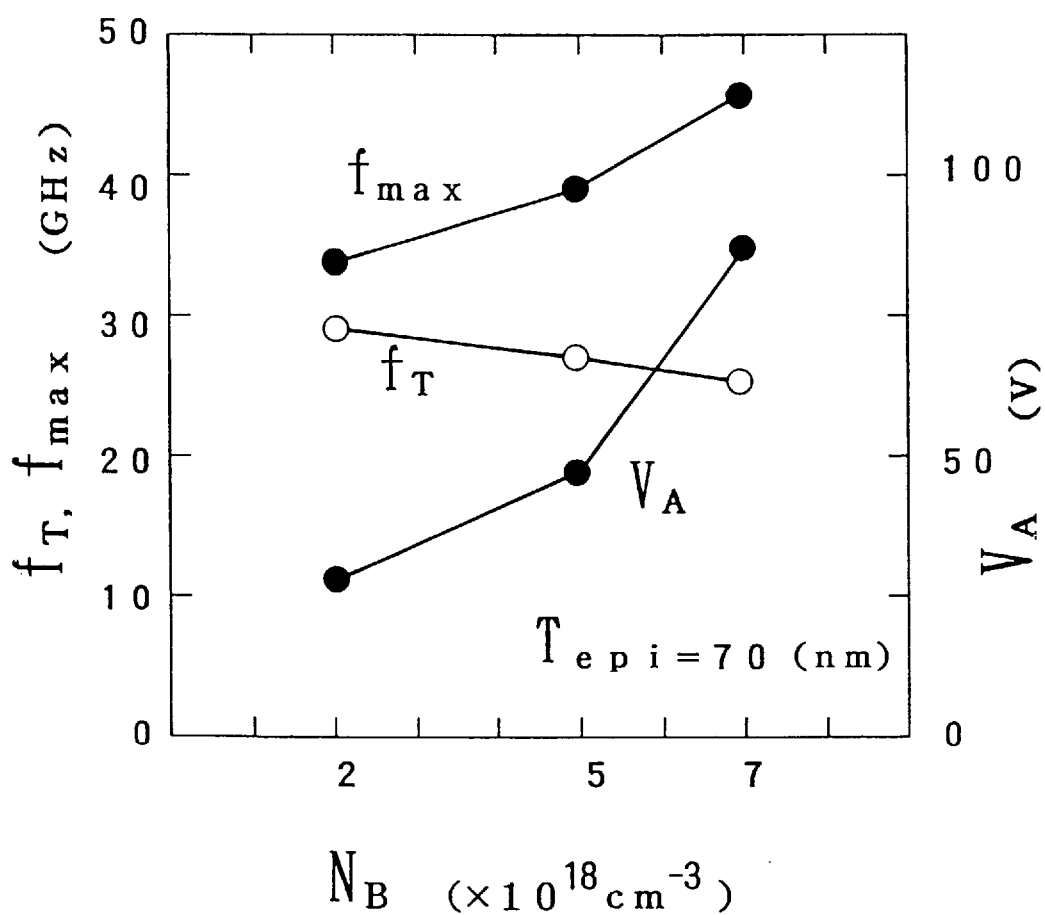
FIG. 9 is a graphical representation showing the characteristics of $f_T$, $f_{max}$ and $V_A$ with respect to $N_B$.

FIGS. 8A, 8B and 8C show the characteristics between the collector current $I_C$, the base current $I_B$ and the base-emitter voltage $V_{BE}$ obtained when the base impurity concentration $N_B$ is $2 \times 10^{18}$cm$^{-3}$, $5 \times 10^{18}$cm$^{-3}$ and $7 \times 10^{18}$cm$^{-3}$, respectively. Further, FIG. 9 shows the characteristics of the cut-off frequency $f_T$, the maximum operating frequency $f_{max}$ and the early voltage $V_A$ with respect to the base impurity concentration $N_B$ thereof. FIGS., 8A, 8B and 8C indicate that no leak current is generated due to tunnel effect, even if the base impurity concentration $N_B$ is increased up to $7 \times 10^{18} \text{cm}^{-3}$. Further, FIG. 9 indicates that the early voltage $V_A$ also increases with increasing base impurity concentration $N_B$ to such an extent as 40 V and 85 V when the base impurity concentration $N_B$ is $5 \times 10^{18} \text{cm}^{-3}$ and $7 \times 10^{18} \text{cm}^{-3}$, respectively. Further, the thickness $T_{epi}$ of the base epitaxial layer of the transistors used for the above-mentioned experiments are all 70 nm.

Figure 10:
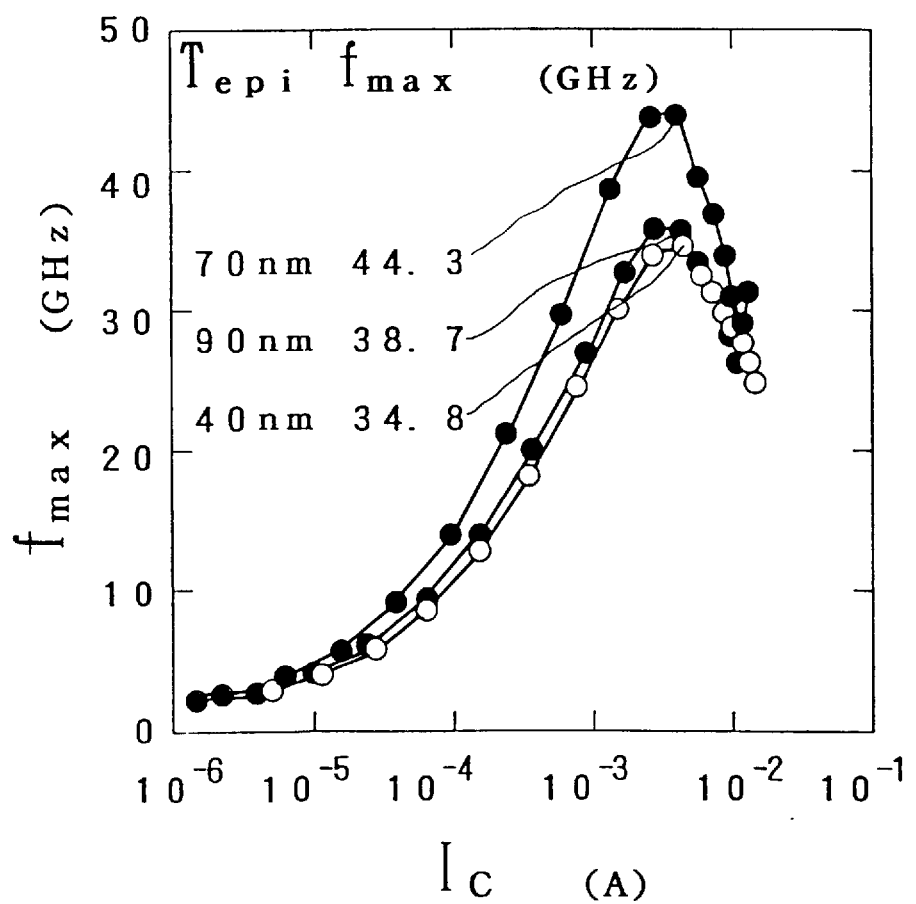
FIG. 10 is a graphical representation showing the characteristics of $f_{max}$ with respect to $I_C$ with the epitaxial base layer as a parameter.
Figure 11:
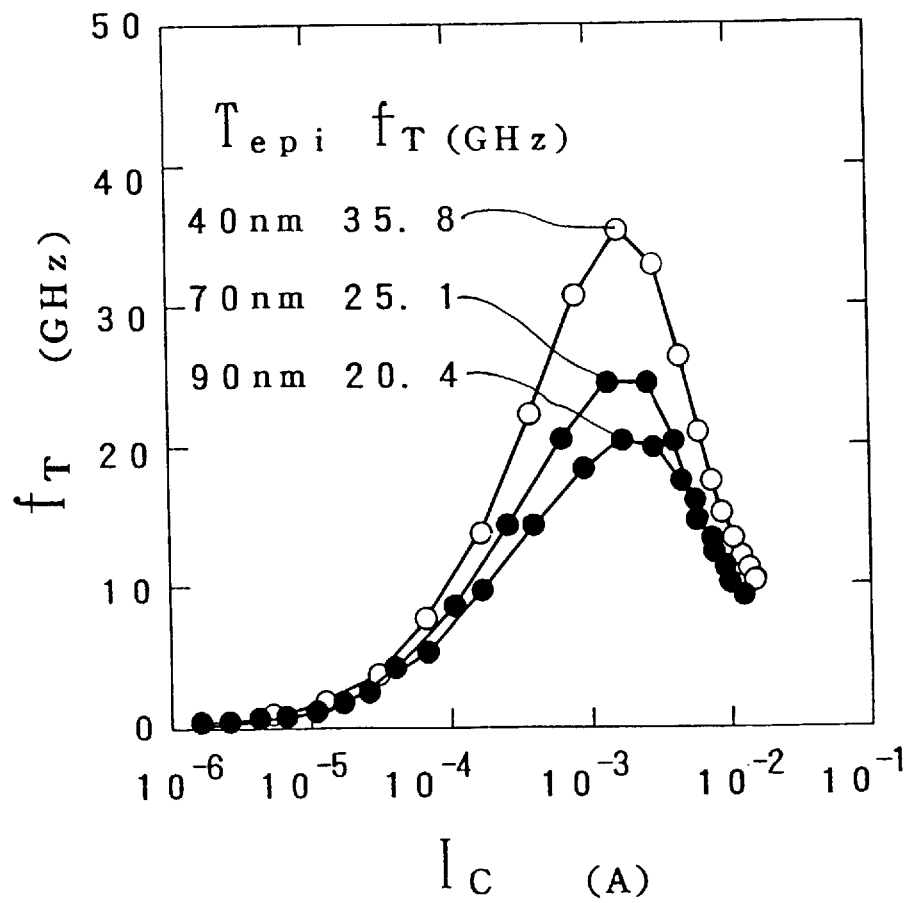
FIG. 11 is a graphical representation showing the characteristics of $f_T$ with respect to $I_C$ with the epitaxial base layer as a parameter.

Further, FIGS. 10 and 11 show the characteristics between the maximum operating frequency $f_{max}$, and the collector current $I_C$ and between the cut-off frequency $f_T$ and the collector current $I_C$, respectively. FIG. 10 indicates that $f_{max}$ can be maximized at 44.3 GHz when $T_{epi}$ is 70 nm. Further, the FIG. 11 indicates that $f_T$ increases with decreasing $T_{epi}$.

Figure 3A:
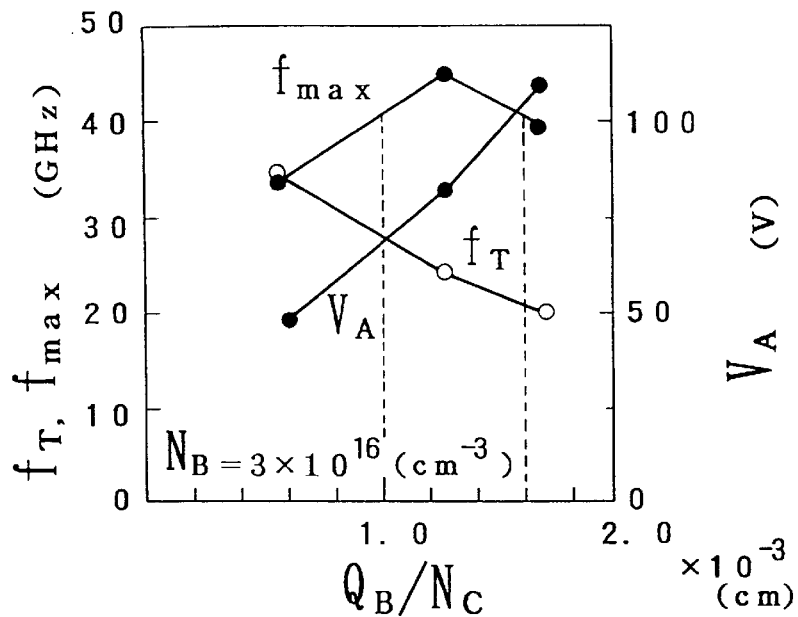
FIG. 3A is a graphical representation showing the characteristics of $f_T$, $f_{max}$ and $V_A$ with respect to $Q_B/N_C$.
Figure 3B:
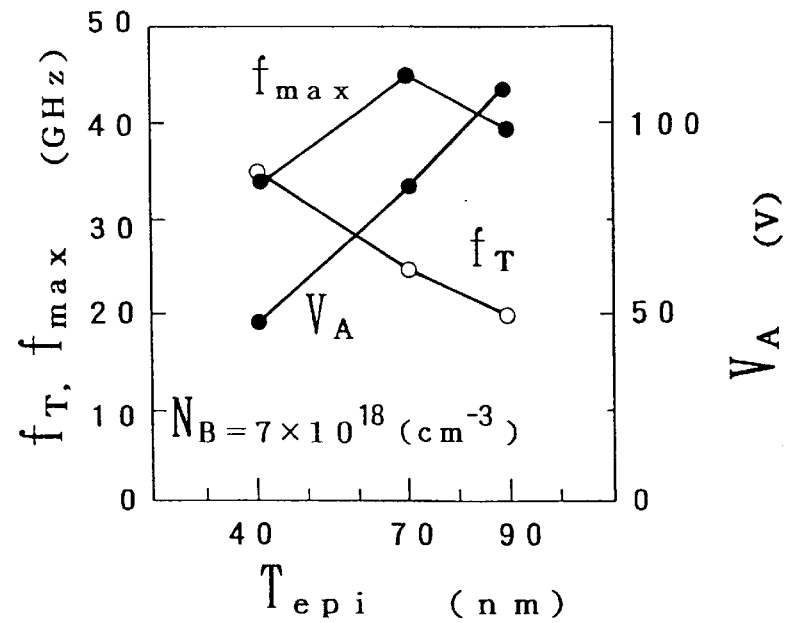
FIG. 3B is a graphical representation showing the characteristics of $f_T$, $f_{max}$ and $V_A$ with respect to $T_{epi}$.

Further, FIG. 3B show changes in the maximum operating frequency $f_{max}$ the cut-off frequency $f_T$ and the early voltage $V_A$ obtained when the thickness $T_{epi}$ of the base epitaxial layer is 40 nm, 70 nm and 90 nm, respectively. FIG. 3B indicates that the early voltage $V_A$ increases with increasing $T_{epi}$ to such an extent that $V_A$ is about 50 V, 85 V and 110 V when $T_{epi}$ is 40 nm, 70 nm and 90 nm, respectively; that is, the early voltage V. fairly changes. In contrast with this, f ranges between 34.8 GHz and 44.3 GHz, without changing largely.

Here, in order to increase both the maximum operating frequency $f_{max}$ and the early voltage $V_A$ as much as possible, how to increase the product of $f_{max}^2$ and $V_A$ is taken into account. Here, $(f_{max}^2 \cdot V_A)$ is proportional to $(Q_B/C_{jc}^2)$ in accordance with the two expressions (1) and (2). On the other hand, the collector-base junction capacitance $C_{jc}$ is proportional to the square root of the collector impurity concentration $N_C$. As a result, $(f_{max}^2 \cdot V_A)$ is proportional to $(Q_B/N_C)$.

Therefore, it has been considered that $(Q_B/N_C)$ is obtained when the thickness of the epitaxial base layer is 40 nm, 70 nm and 90 nm, respectively as described above. Here, as shown in FIG. 17A, since the thickness $W_e$ of the emitter layer is kept at 15 nm, when $T_{epi}$ is 40 nm, 70 nm and 90 nm, respectively, the thickness of the base layer $W_B$ is 25 nm, 55 nm and 75 nm, respectively. Therefore, since the base impurity concentration $N_B$ is $7 \times 10^{18} \text{cm}^{-3}$, the base Gummel number $Q_B$ obtained when $T_{epi}$ is 40 nm, 70 nm and 90 nm, respectively is $1.75 \times 10^{13} \text{cm}^{-2}$, $3.85 \times 10^{13} \text{cm}^{-2}$ and $5.25 \times 10^{13} \text{cm}^{-2}$, respectively. On the other hand, since the collector impurity concentration $N_C$ is $3 \times 10^{16} \text{cm}^{-3}$, $(Q_B/N_C)$ obtained when $T_{epi}$ is 40 nm, 70 nm and 90 nm, respectively is $0.583 \times 10^{-3} \text{cm}$, $1.28 \times 10^{-3} \text{cm}$ and $1.75 \times 10^{-3} \text{cm}$, respectively.

FIG. 3A shows the characteristics of the maximum operating frequency $f_{max}$, the cut-off frequency $f_T$ and the early voltage $V_A$ with respect to $(Q_B/N_C)$ obtained under these conditions. In FIG. 3A, the values of $f_{max}$ and $V_A$ are actually measured data.

Figure 1B:
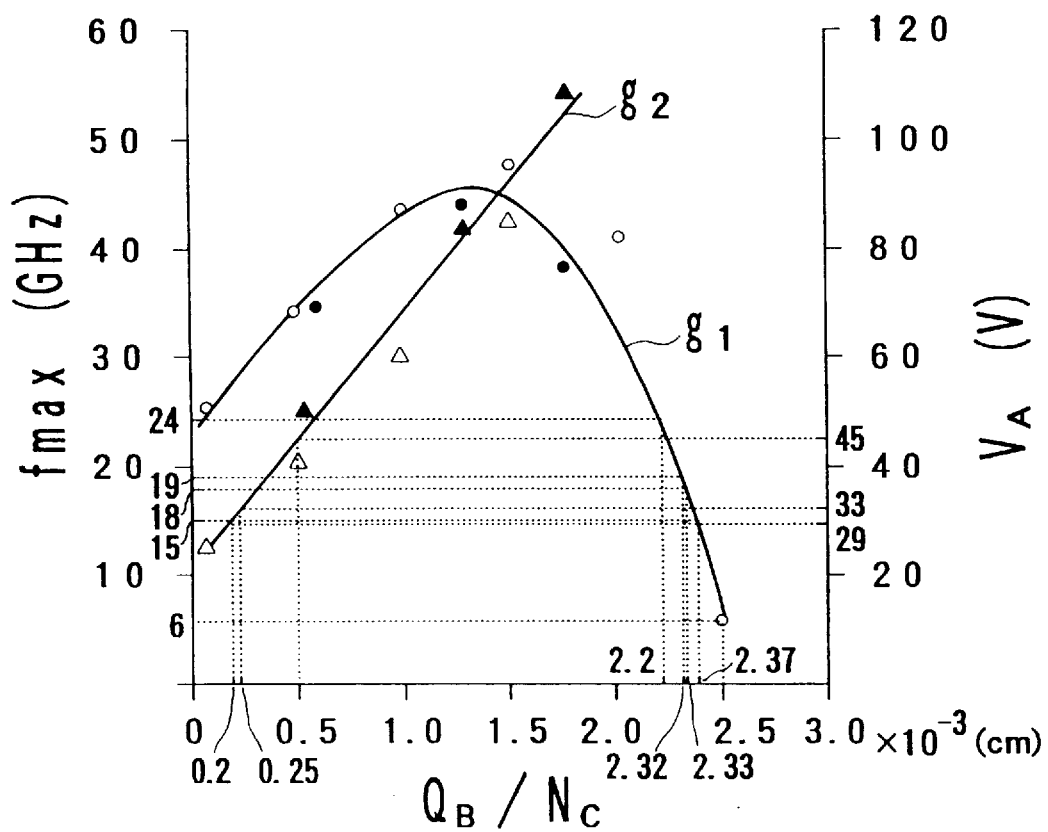

Here, a simulation is made to obtain the characteristics of the maximum operating frequency $f_{max}$ and the early voltage $V_A$ with respect to various values of $(Q_B/N_C)$. FIGS. 1A and 1B show the simulation results and the actually measured data, symbols ● designate the actually measured data of the maximum operating frequency $f_{max}$; symbols ○ designate the simulation results of the maximum operating frequency $f_{max}$; symbols Δ designate the actually measured data of the early voltage $V_A$; symbols Δ designate the simulation results of the early voltage $V_A$. On the basis of both the actually measured data and the simulation results, the characteristics of the maximum operating frequency $f_{max}$ can be represented by $g_1$ in FIGS. 1A and 1B, and those of the early voltage $V_A$ can be represented by $g_2$.

As the future optical communications systems and mobile communications systems, as shown in FIG. 2, there are various systems such as a 600 Mbps (Mega bits per sec) optical communications system, a 2.4 Gbps (Giga bits per sec) optical communications system, a 900 MHz mobile telephone system, a 1.5 GHz automotive vehicle telephone system, a 1.8 GHz mobile telephone system, a 1.9 GHz mobile telephone system, a 2.4 GHz radio LAN (Local Area Network) system, etc. FIG. 2 also show the respective preferred values of $(Q_B/N_C)$ obtained on the basis of the supply voltages (V), the maximum operating frequencies $f_{max}$ (GHz), the early voltages $V_A$ (V), and $(f_{max} \cdot V_A)$ of these systems and in accordance with FIGS. 1A and 1B.

FIG. 2 indicates that the bipolar transistors can be used for the respective communications systems as listed in FIG. 2, when the values of $(Q_B/N_C)$ exist between $0.2 \times 10^{-3} \text{cm}$ and $2.5 \times 10^{-3} \text{cm}$.

As described above, in the first embodiment of the semiconductor device according to the present invention, when the ratio $Q_B/N_C$ of the base Gummel number $Q_B$ to the impurity concentration $N_C$ of the bipolar transistors is decided in a range from $0.2 \times 10^{-3} \text{cm}$ to $2.5 \times 10^{-3} \text{cm}$, it is possible to determine the early voltage $V_A$ beyond 29 V and the maximum operating frequency $f_{max}$ beyond 6 GHz, respectively.

In addition, in the first embodiment, when $Q_B/N_C$ is decided in a range from $0.5 \times 10^{-3} \text{cm}$ to $2.5 \times 10^{-3} \text{cm}$, it is possible to determine the early voltage $V_A$ beyond 45 V and the maximum operating frequency $f_{max}$ beyond 6 GHz (See FIG. 1A), respectively, so that the bipolar transistors according to the present invention can be used agreeable as the 600 Mbps optical communications system having a supply voltage of 3.3 V. In addition, when $Q_B/N_C$ is decided in a range from $0.5 \times 10^{-3} \text{cm}$ to $2.45 \times 10^{-3} \text{cm}$, it is possible to determine the early voltage $V_A$ beyond 45 V and the maximum operating frequency $f_{max}$ beyond 9 GHz (See FIG. 1A), respectively, so that the bipolar transistors according to the present invention can be used agreeable as the 900 MHz mobile telephone system having a supply voltage of 3.3 V. In addition, when $Q_B/N_C$ is decided in a range from $0.5 \times 10^{-3} \text{cm}$ to $2.37 \times 10^{-3} \text{cm}$, it is possible to determine the early voltage $V_A$ beyond 45 V and the maximum operating frequency $f_{max}$ beyond 15 GHz (See FIG. 1B), respectively, so that the bipolar transistors according to the present invention can be used agreeable as the 1.5 GHz automotive vehicle telephone system having a supply voltage of 3.3 V. In addition, when $Q_B/N_C$ is decided in a range from $0.5 \times 10^{-3} \text{cm}$ to $2.2 \times 10^{-3} \text{cm}$, it is possible to determine the early voltage $V_A$ beyond 45 V and the maximum operating frequency $f_{max}$ beyond 24 GHz (See FIG. 1B), respectively, so that the bipolar transistors according to the present invention can be used agreeable as the 2.4 Gbps optical communications system having a supply voltage of 3.3 V and as the 2.4 GHz radio LAN system having a supply voltage of 3.3 V.

Further, in the first embodiment, when $Q_B/N_C$ is decided in a range from $0.25 \times 10^{-3} \text{cm}$ to $2.45 \times 10^{-3} \text{cm}$, it is possible to determine the early voltage $V_A$ beyond 33 V and the maximum operating frequency $f_{max}$ beyond 9GHz (See FIG. 1A), respectively, so that the bipolar transistors according to the present invention can be used agreeable as the 900 MHz mobile telephone system having a supply voltage of 2.7 V. In addition, when $Q_B/N_C$ is decided in a range from $0.25 \times 10^{-3} \text{cm}$ to $2.33 \times 10^{-3} \text{cm}$, it is possible to determine the early voltage $V_A$ beyond 33 V and the maximum operating frequency $f_{max}$ beyond 18 GHz (See FIG. 1B), respectively, so that the bipolar transistors according to the present invention can be used agreeable as the 1.8 GHz mobile telephone system having a supply voltage lower than 2.7 V. In addition, when $Q_B/N_C$ is decided in a range from 0.25× $10^{-3}$cm to 2.32×$10^{-3}$cm, it is possible to determine the early voltage $V_A$ beyond 33 V and the maximum operating frequency $f_{max}$ beyond 19 GHz (See FIG. 1B), respectively, so that the bipolar transistors according to the present invention can be used agreeable as the 1.9 GHz mobile telephone system having a supply voltage lower than 2.7 V.

Further, in the first embodiment, when $Q_B/N_C$ is decided in a range from 1.2×$10^{-3}$cm to 2.5×$10^{-3}$cm, it is possible to determine the early voltage $V_A$ beyond 79 V and the maximum operating frequency $f_{max}$ beyond 6 GHz (See FIG. 1A), respectively, so that the bipolar transistors according to the present invention can be used agreeable as the 600 Mbps optical communications system having a supply voltage of 5 V. In addition, when $Q_B/N_C$ is decided in a range from 1.2×$10^{-3}$cm to 2.2×$10^{-3}$cm, it is possible to determine the early voltage $V_A$ beyond 79 V and the maximum operating frequency $f_{max}$ beyond 24 GHz (See FIG. 1A), respectively, so that the bipolar transistors according to the present invention can be used agreeable as the 2.4 Gbps optical communications system having a supply voltage of 5.0 V. Further, in the first embodiment, when $Q_B/N_C$ is decided in a range from 0.2×$10^{-3}$cm to 2.37×$10^{-3}$cm, it is possible to determine the early voltage $V_A$ beyond 29 V and the maximum operating frequency $f_{max}$ beyond 15 GHz (See FIG. 1B), respectively, so that the bipolar transistors according to the present invention can be used agreeable as the 1.5 GHz automotive vehicle telephone system having a supply voltage of 2.5 V.

Figure 12:
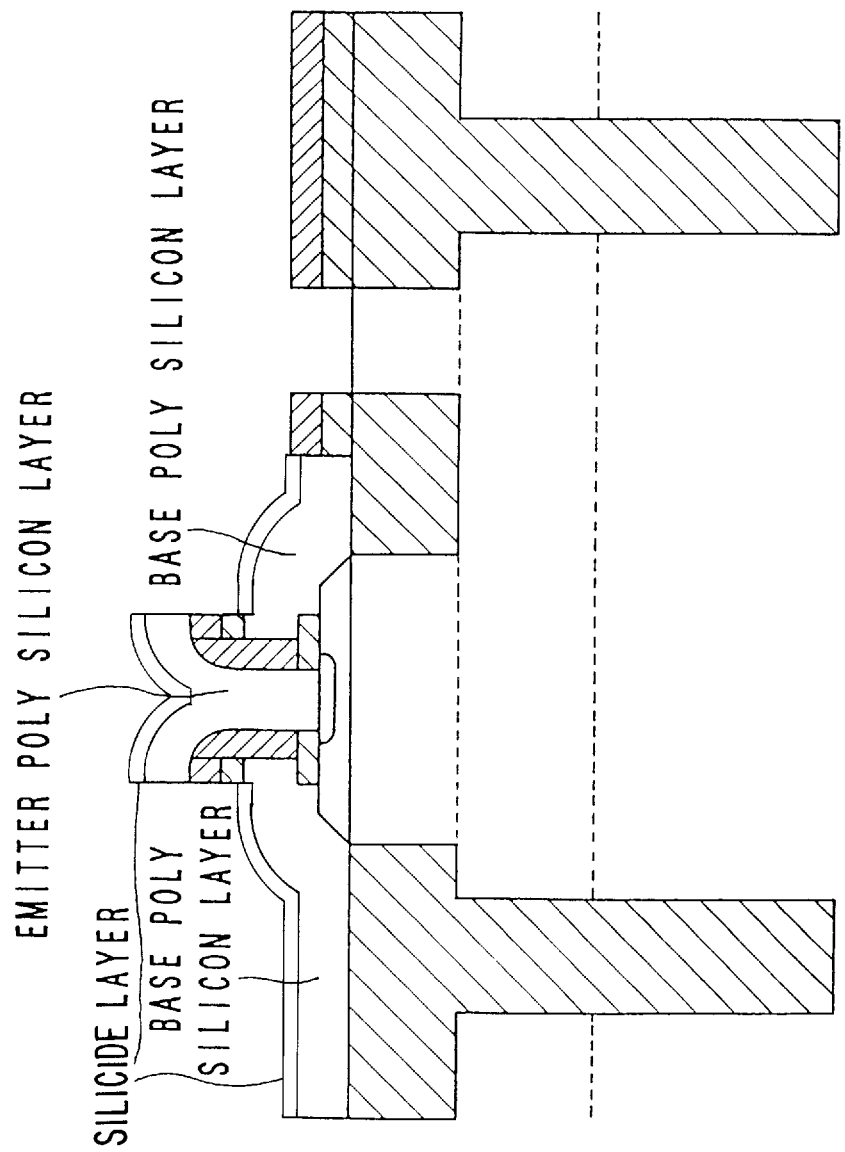
FIG. 12 is a cross-sectional view showing a second embodiment of the semiconductor device according to the present invention.
Figure 13:
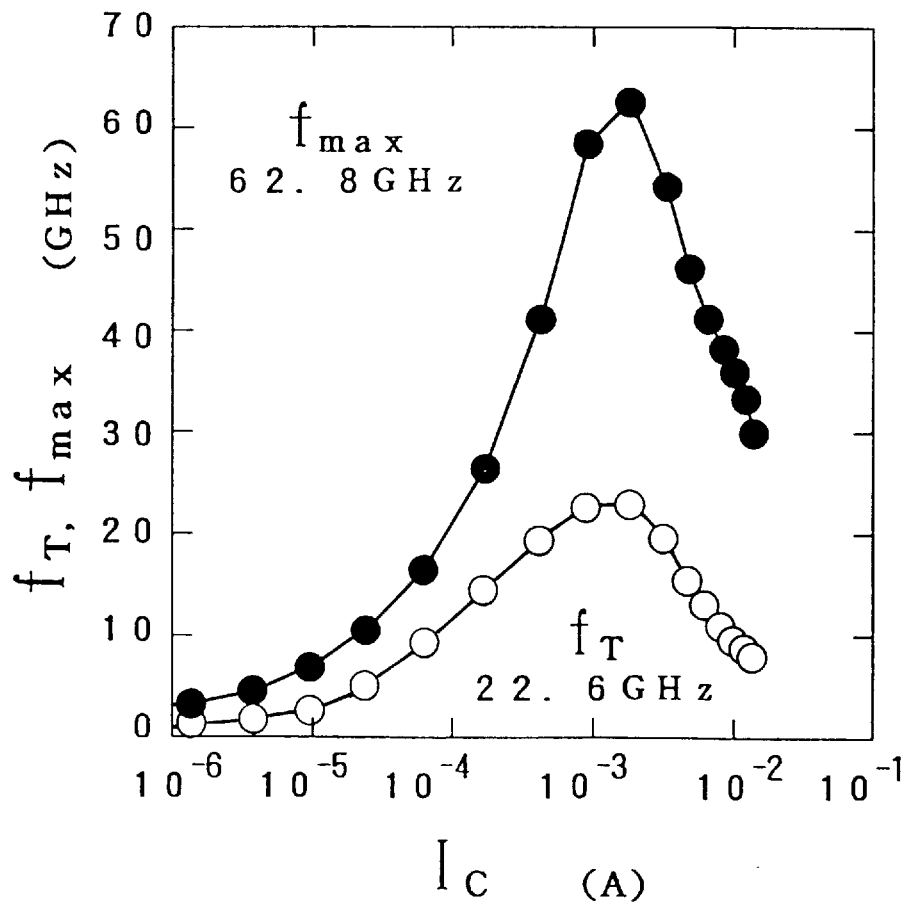
FIG. 13 is a graphical representation showing the characteristics of $f_T$ and $f_{max}$ with respect to $I_C$ of the second embodiment.

A second embodiment of the semiconductor device according to the present invention will be described hereinbelow with reference to FIGS. 12 to 15. In this second embodiment, as shown in FIG. 12, a silicide layer (e.g., NiSi) is formed on a base leading electrode (base poly silicon layer) of the semiconductor device having the base epitaxial layer whose thickness $T_{epi}$ is 70 nm (i.e., of the first embodiment). FIG. 13 shows the characteristics of the maximum operating frequency $f_{max}$ and the cut-off frequency $f_T$ with respect to the collector current $I_C$ of the semiconductor device of this second embodiment. FIG. 13 indicates that it is possible to increase $f_{max}$ as high as 62.8 GHz. On the other hand, $f_T$ is slightly reduced, without being changed markedly.

Figure 14:
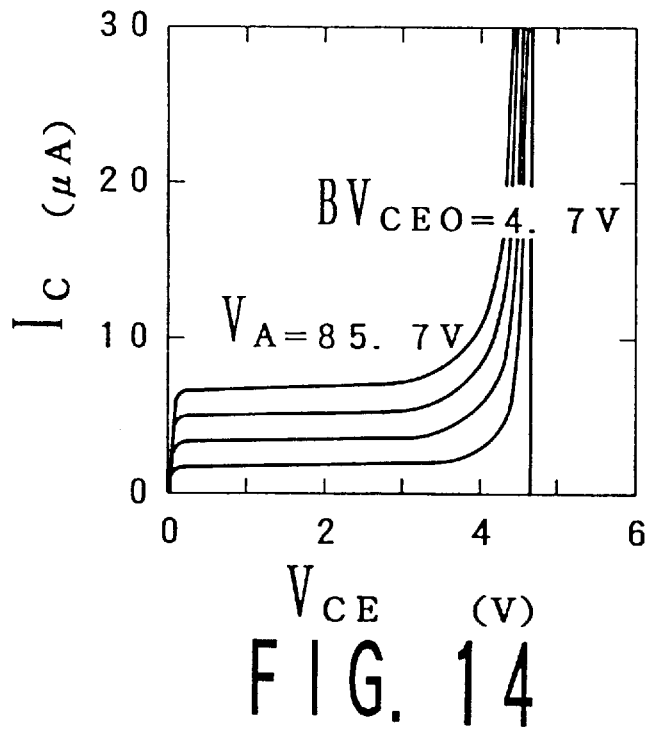
FIG. 14 is a graphical representation showing the characteristics of $I_C$ with respect to $V_{CE}$.

Further, FIG. 14 shows the characteristics between the collector current $I_C$ and the collector-emitter voltage $V_{CE}$. The characteristics shown in FIG. 14 are obtained by changing the base current $I_B$ from zero to 100 nA. Further, when the base thereof is kept open, the breakdown voltage $BV_{CEO}$ between the collector and emitter is 4.7 V. Further, the early voltage $V_A$ obtained from the characteristics shown in FIG. 14 is 85.7 V, which is almost the same as with the case of the first embodiment.

Figure 15:
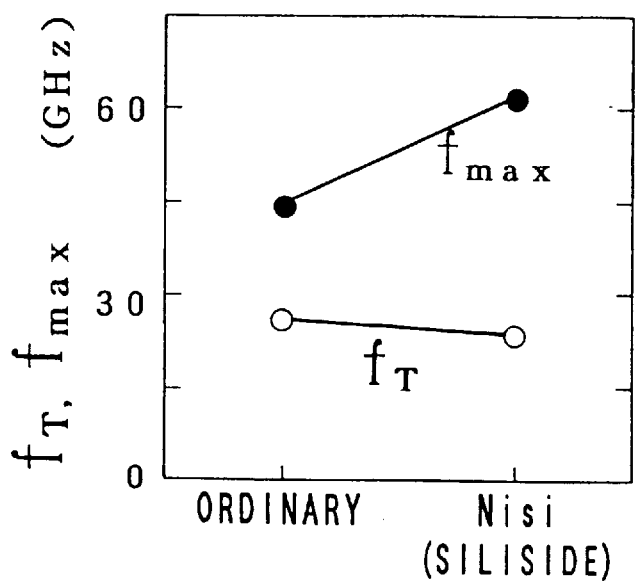
FIG. 15 is a graphical representation showing the effect of the second embodiment.

As described above, in this second embodiment, since the base leading electrode is formed of siliside, it is possible to increase $f_{max}$ markedly, without reducing $f_T$ much, as depicted in FIG. 15. As a result, in the semiconductor device of the second embodiment, it is possible to increase both the early voltage $V_A$ and the maximum operating frequency $f_{max}$ at the same time.

What is claimed is:

1. A semiconductor device provided with a bipolar transistor including a collector region, a base region formed on the collector region, an emitter region formed in contact with the base region, a base leading electrode connected to the base region, and an emitter electrode connected to the emitter region, wherein a ratio QB/NC of base Gummel number QB to impurity concentration NC of the collector region opposite to the emitter region of the bipolar transistor lies within a range from 0.5×$10^{-3}$cm to 2.5×$10^{-3}$cm, and the base Gummel number QB lies within a range from 1.75× $10^{13}$cm$^{-2}$ to 5.25×$10^{13}$cm$^{-2}$.

2. The semiconductor device of claim 1, wherein the ratio QB/NC is between 0.5×$10^{-3}$cm and 2.45×$10^{-3}$cm.

3. The semiconductor device of claim 2, wherein the ratio QB/NC is between 0.5×$10^{-3}$cm and 2.37×$10^{-3}$cm.

4. The semiconductor device of claim 3, wherein the ratio QB/NC is between 0.5×$10^{-3}$cm and 2.2×$10^{-3}$cm.

5. The semiconductor device of claim 1, wherein the ratio QB/NC is between 1.2×$10^{-3}$cm and 2.5×$10^{-3}$cm.

6. The semiconductor device of claim 5, wherein the ratio i/Nc is between 1.2×$10^{-3}$cm and 2.2×$10^{-3}$cm.

7. The semiconductor device of claim 1, wherein a silicide layer is formed on the base leading electrode.

8. The semiconductor device of claim 1, wherein a length of the base region lies within a range from 25 nm to 75 nm.

9. A semiconductor device provided with a bipolar transistor including a collector region, a base region formed on the collector region, an emitter region formed in contact with the base region, a base leading electrode connected to the base region, and an emitter electrode connected to the emitter region, wherein a ratio QB/NC of base Gummel number QB to impurity concentration NC of the collector region opposite to the emitter region of the bipolar transistor lies within a range from 0.25×$10^{-3}$cm to 2.45×$10^{-3}$cm, and the base Gummel number QB lies within a range from 1.75×$10^{13}$cm$^{-2}$ to 5.25×$10^{13}$cm$^{-2}$.

10. The semiconductor device of claim 9, wherein the ratio QB/NC is between 0.25×$10^{-3}$cm to 2.33×$10^{-3}$cm.

11. The semiconductor device of claim 10, wherein the ratio QB/NC is between 0.25×$10^{-3}$cm to 2.32×$10^{-3}$cm.

12. The semiconductor device of claim 9, wherein a silicide layer is formed on the base leading electrode.

13. The semiconductor device of claim 9, wherein a length of the base region lies within a range from 25 nm to 75 nm.

14. A semiconductor device provided with a bipolar transistor including a collector region, a base region formed on the collector region, an emitter region formed in contact with the base region, a base leading electrode connected to the base region, and an emitter electrode connected to the emitter region, wherein a ratio QB/NC of base Gunnnel number QB to impurity concentration NC of the collector region opposite to the emitter region of the bipolar transistor lies within a range from 0.25×$10^{-3}$cm to 2.45×$10^{-3}$cm, the base Gummel number QB lies within a range from 1.75× $10^{13}$cm$^{-2}$ to 5.25×$10^{13}$cm$^{-2}$, and the semiconductor device has an early voltage of at least 29 V and maximum operating frequency of at least 6 GHz.

15. The semiconductor device of claim 14, wherein a silicide layer is formed on the base leading electrode.

16. The semiconductor device of claim 14, wherein a length of the base region lies within a range from 25 nm to 75 nm.

* * * * *